United States Patent
Sai et al.

(10) Patent No.: US 7,173,287 B2
(45) Date of Patent: Feb. 6, 2007

(54) SEMICONDUCTOR LIGHT-EMITTING DEVICE

(75) Inventors: Hironobu Sai, Kyoto (JP); Haruo Tanaka, Shiga (JP)

(73) Assignee: Rohm Co., Ltd., Kyoto-Fu (JP)

( * ) Notice: Subject to any disclaimer, the term of this patent is extended or adjusted under 35 U.S.C. 154(b) by 0 days.

(21) Appl. No.: 11/202,368

(22) Filed: Aug. 12, 2005
(Under 37 CFR 1.47)

(65) Prior Publication Data
US 2006/0054908 A1    Mar. 16, 2006

(30) Foreign Application Priority Data
Aug. 12, 2004 (JP) .......................... P2004-235138

(51) Int. Cl.
*H01L 27/15* (2006.01)
*H01L 31/12* (2006.01)
(52) U.S. Cl. .......................................... 257/79; 257/96
(58) Field of Classification Search .................. 257/79, 257/85, 11, 94, 96–97, 184, 189
See application file for complete search history.

(56) References Cited

U.S. PATENT DOCUMENTS 5,237,581 A * 8/1993 Asada et al. ............. 372/45.01
5,442,203 A * 8/1995 Adomi et al. ................ 257/97

FOREIGN PATENT DOCUMENTS

JP    2003-273399    9/2003

* cited by examiner

*Primary Examiner*—Theresa T. Doan
(74) *Attorney, Agent, or Firm*—McDermott Will & Emery LLP

(57) ABSTRACT

A semiconductor light-emitting device is made of a group III-nitride compound semiconductor expressed as $Al_xGa_yIn_{1-x-y}N$ (where $0 \leq x \leq 1$, $0 \leq y \leq 1$, and $0 \leq x+y \leq 1$). The semiconductor light-emitting device includes: a substrate made of SiC; a semiconductor layer which is placed above the substrate and has a light-emitting region; a multi-layered reflective layer which is placed between the substrate and the semiconductor layer and which reflects light produced in the light-emitting region; and a phase matching layer which is placed between the substrate and the multi-layered reflective layer and which reflects light produced in the light-emitting region and matches a phase of light reflected from a lower boundary surface of the multi-layered reflective layer and a phase of light reflected from a lower boundary surface of the substrate among light produced in the light-emitting region. A thickness of the phase matching layer is set so that a quantity of interfering light produced by the interference of light reflected from the lower boundary surface of the multi-layered reflective layer, light reflected from a lower boundary surface of the phase matching layer, and light reflected from the lower boundary surface of the substrate among light produced in the light-emitting region is locally maximized when the substrate has a predetermined thickness.

3 Claims, 5 Drawing Sheets

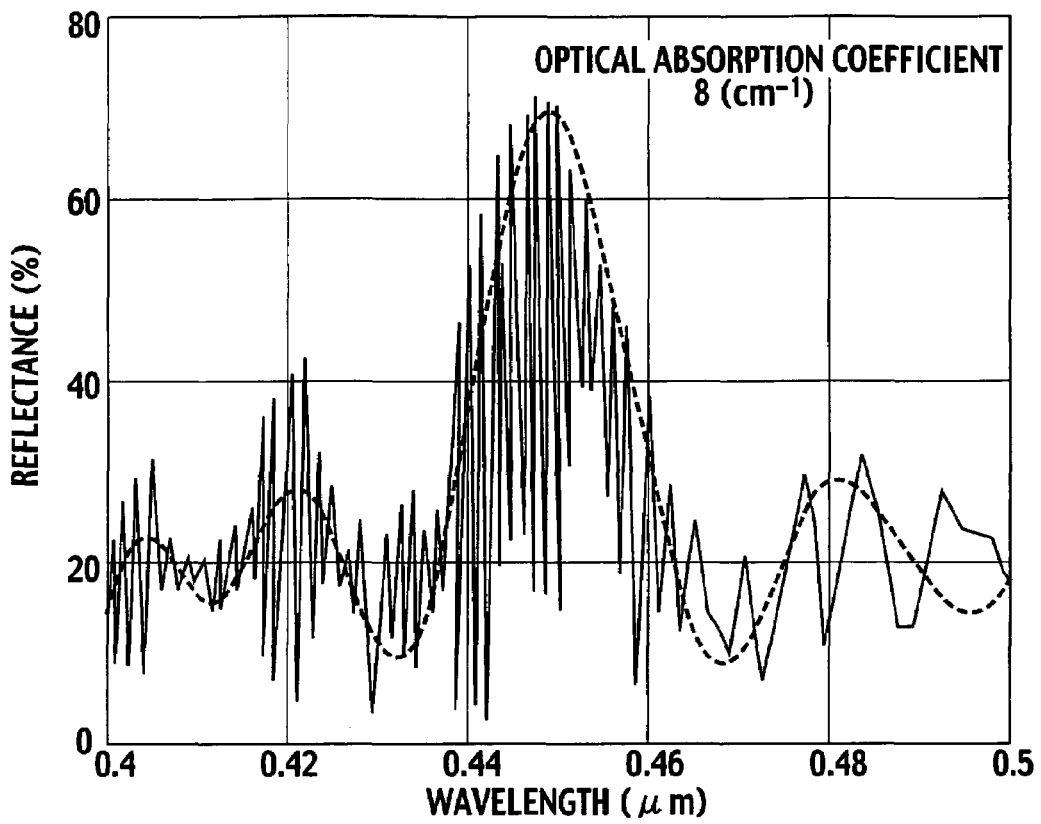
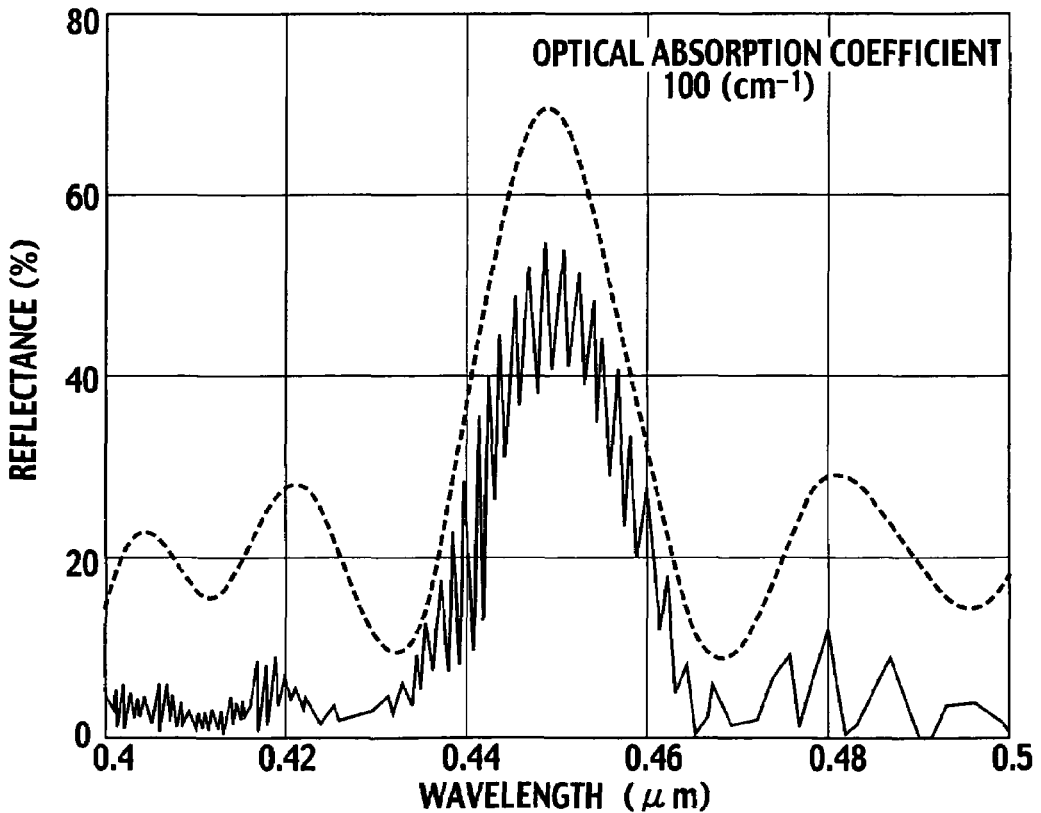

SEMICONDUCTOR LIGHT-EMITTING DEVICE

CROSS REFERENCE TO RELATED APPLICATION

This application is based upon and claims the benefit of priority from the prior Japanese Patent Application No. P2004-235138, filed on Aug. 12, 2004; the entire contents of which are incorporated herein by reference.

BACKGROUND OF THE INVENTION

1. Field of the Invention

The present invention relates to a semiconductor light-emitting device made of a group III-nitride compound semiconductor.

2. Description of the Related Art

A conventional semiconductor light-emitting device made of a group III-nitride compound semiconductor includes, in order of mention, a buffer layer and a semiconductor layer having a light-emitting region on a substrate made of a material such as SiC. The semiconductor light-emitting device further includes a multi-layered reflective layer between the substrate and the semiconductor layer in order to improve the emission efficiency of light produced in the light-emitting region. Of the light produced in the light-emitting region, light directed toward the substrate is reflected from the multi-layered reflective layer, whereby the emission efficiency is improved.

However, the multi-layered reflective layer cannot reflect 100% of the light produced in the light-emitting region, and allows several % of the light to leak through the lower boundary surface of the multi-layered reflective layer. In the case where a substrate made of SiC is used as the substrate, the light leaked from the lower boundary surface of the multi-layered reflective layer propagates in the substrate to be reflected from the lower boundary surface of the substrate. Further, the light reflected from the lower boundary surface of the substrate interferes, at the upper boundary surface of the substrate, with the light leaked from the lower boundary surface of the multi-layered reflective layer.

Accordingly, depending on the thickness of the substrate, the light reflected from the lower boundary surface of the substrate and the light leaked from the lower boundary surface of the multi-layered reflective layer interfere with each other at the upper boundary surface of the substrate, and this causes a decrease in the light emission efficiency. In the conventional semiconductor light-emitting devices made of group III-nitride compound semiconductors, there may be cases where light emission efficiency significantly decreases because of lack of knowledge about substrate thickness.

BRIEF SUMMARY OF THE INVENTION

The present invention has been made considering the problems, and its object is to provide a semiconductor light-emitting device which is made of a group III-nitride compound semiconductor, in which the influence of light reflected from the lower side of a substrate that causes a decrease in the emission efficiency of light produced in a light-emitting region is decreased, the emission efficiency of the light produced in the light-emitting region is improved, and a buffer layer between the substrate and a semiconductor layer having the light-emitting region is omitted.

A first aspect of the present invention is summarized as a semiconductor light-emitting device made of a group III-nitride compound semiconductor expressed as $Al_xGa_yIn_{1-x-y}N$ (where $0 \leq x \leq 1$, $0 \leq y \leq 1$, and $0 \leq x+y \leq 1$), the semiconductor light-emitting device includes: a substrate made of SiC; a semiconductor layer which is placed above the substrate and has a light-emitting region; a multi-layered reflective layer which is placed between the substrate and the semiconductor layer and which reflects light produced in the light-emitting region; and a phase matching layer which is placed between the substrate and the multi-layered reflective layer and which reflects light produced in the light-emitting region and matches a phase of light reflected from a lower boundary surface of the multi-layered reflective layer and a phase of light reflected from a lower boundary surface of the substrate among light produced in the light-emitting region, wherein a thickness of the phase matching layer is set so that a quantity of interfering light produced by the interference of light reflected from the lower boundary surface of the multi-layered reflective layer, light reflected from a lower boundary surface of the phase matching layer, and light reflected from the lower boundary surface of the substrate among light produced in the light-emitting region is locally maximized when the substrate has a predetermined thickness.

In the first aspect, a carrier density of the substrate can be equal to or less than $10^{19}$ cm$^{-3}$. In the first aspect, the number of layers included in the multi-layered reflective layer can be equal to or more than 20 pairs.

BRIEF DESCRIPTION OF THE SEVERAL VIEWS OF THE DRAWINGS

FIG. 3A is a view illustrating reflection characteristics for the case where light produced in the light-emitting region is reflected from the lower boundary surface of a substrate, with the optical absorption coefficient of the substrate being 8 cm$^{-1}$; and FIG. 3B is a view illustrating reflection characteristics for the case where light produced in the light-emitting region is reflected from the lower boundary surface of the substrate, with the optical absorption coefficient of the substrate being 100 cm$^{-1}$.

DETAILED DESCRIPTION OF THE INVENTION

Figure 1:
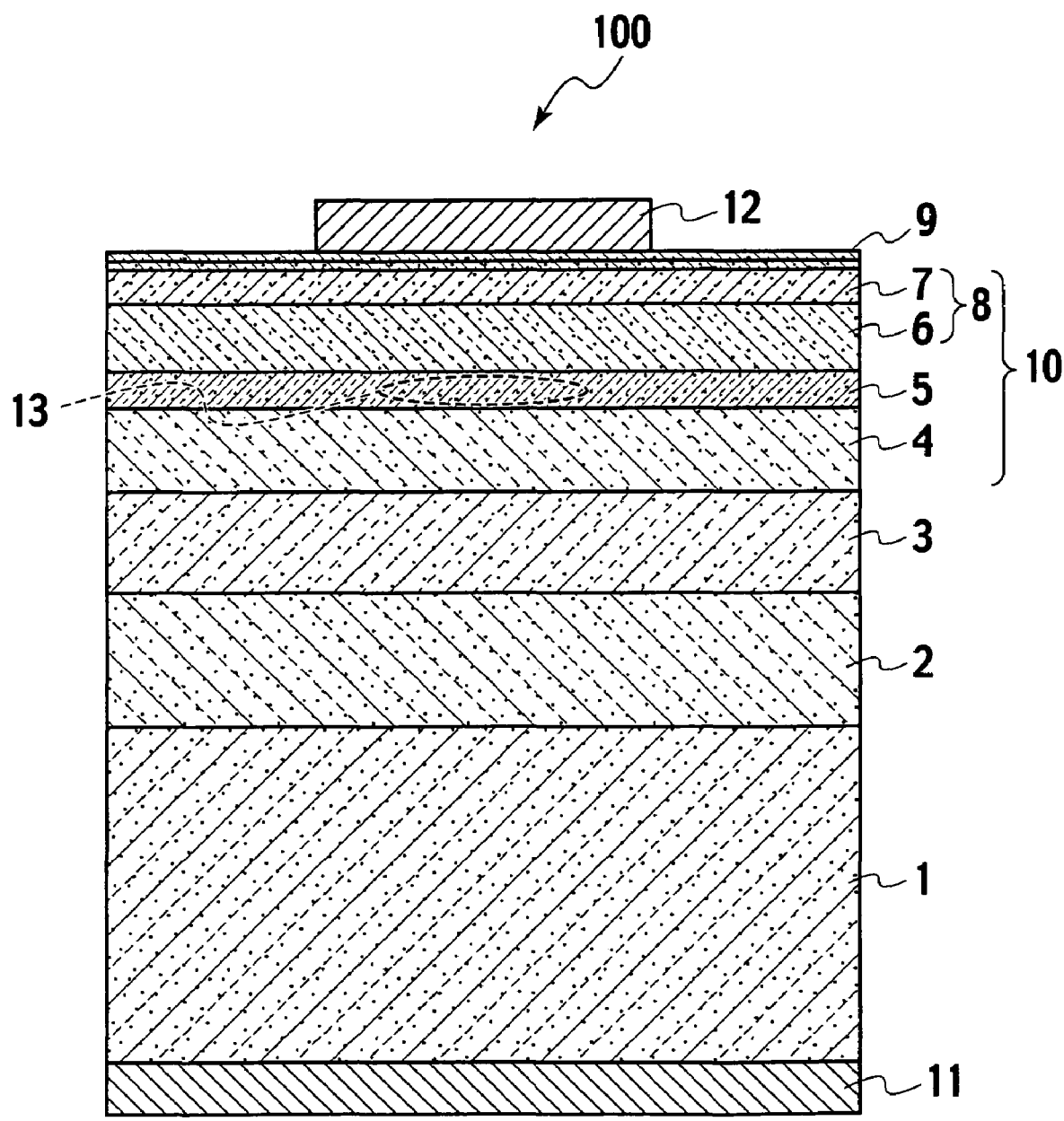
FIG. 1 is a view of a schematic structure of a semiconductor light-emitting device according to an embodiment.

Hereinafter, the present invention will be described in detail by showing an embodiment. However, the present invention should not be construed as limited to the description below. FIG. 1 is a view of a schematic structure of a semiconductor light-emitting device according to this embodiment.

The semiconductor light-emitting device 100 according to this embodiment is a semiconductor light-emitting device made of a group III-nitride compound semiconductor which is expressed as $Al_xGa_yIn_{1-x-y}N$ (where $0 \leq x \leq 1$, $0 \leq y \leq 1$, and $0 \leq x+y \leq 1$). The semiconductor light-emitting device 100 includes a substrate 1 made of SiC, a semiconductor layer 10 which is placed above the substrate 1 and has a light-emitting region 13, a multi-layered reflective layer 3 which is placed between the substrate 1 and the semiconductor layer 10 and reflects light produced in the light-emitting region 13, and a phase matching layer 2 which is placed between the substrate 1 and the multi-layered reflective layer 3 and reflects light produced in the light-emitting region 13 and matches the phase of light reflected from the lower boundary surface of the multi-layered reflective layer 3 and the phase of light reflected from the lower boundary surface of the substrate 1 among the light produced in the light-emitting region 13.

The semiconductor light-emitting device 1 further includes a second electrode 11 formed under the lower boundary surface of the substrate 1, an upper multi-layered reflective layer 9 formed on the upper surface of the semiconductor layer 10, and a first electrode 12 formed on the upper surface of the upper multi-layered reflective layer 9.

As described previously, the inventors of the present invention accomplished the present invention by using the phase matching layer 2. The inventors paid attention on the fact that the intensity of light produced in the light-emitting region 13 is periodically changed at the upper boundary surface of the substrate 1 by changing the thickness of the phase matching layer 2.

It should be noted that there are cases where the lower boundary surface of the multi-layered reflective layer 3 and the lower boundary surface of the phase matching layer 2 are unclear in terms of appearance. However, light produced in the light-emitting region 13 is reflected at a boundary portion between media having significantly different refractive indices. Accordingly, the lower boundary surface of the multi-layered reflective layer 3 exists in a portion in which there is a significantly large difference in refractive index between the multi-layered reflective layer 3 and a layer placed directly under the multi-layered reflective layer 3. Further, the lower boundary surface of the phase matching layer 2 exists in a portion in which there is a significantly large difference in refractive index between the phase matching layer 2 and a layer placed directly under the phase matching layer 2.

The semiconductor layer 10 including the light-emitting region 13 is made of a group III-nitride compound semiconductor which is expressed as $Al_xGa_yIn_{1-x-y}N$ (where $0 \leq x \leq 1$, $0 \leq y \leq 1$, and $0 \leq x+y \leq 1$). In this embodiment, the semiconductor layer 10 is a layer including a second conductivity-type semiconductor layer 4 and a first conductivity-type semiconductor layer 8 in this order, and has a double heterojunction in which an active layer 5 is further provided between the second conductivity-type semiconductor layer 4 and the first conductivity-type semiconductor layer 8. With the double heterojunction, the associativity of positive holes and electrons can be enhanced to improve emission efficiency in the active layer 5.

The second conductivity-type semiconductor layer 4 is made of an n- or p-type group III-nitride compound semiconductor which is expressed as $Al_xGa_yIn_{1-x-y}N$ (where $0 \leq x \leq 1$, $0 \leq y \leq 1$, and $0 \leq x+y \leq 1$), and may be a single layer or may be multi-layered. Further, the layer thickness is also appropriately adjusted according to design variables.

For example, in the example illustrated in FIG. 1, a single n- or p-type layer made of GaN is adopted as the second conductivity-type semiconductor layer 4. However, the second conductivity-type semiconductor layer 4 may include a layer having other function, e.g., a positive-hole or electron barrier layer, depending on the polarity of the second conductivity-type semiconductor layer 4.

The active layer 5 may be of an arbitrary type, such as one having a bulk structure, a single quantum well structure, or a multiple quantum well structure. In the example illustrated in FIG. 1, one made of a bulk crystal of $In_{1-y}Ga_yN$ (where $0 \leq y \leq 1$) is adopted, but a single quantum well structure or a multiple quantum well structure may be adopted.

In the case where a single quantum well structure or a multiple quantum well structure is adopted, the single quantum well structure or the multiple quantum well structure is formed by alternately depositing layers having smaller band gaps as well layers and layers having larger band gaps as barrier layers. For example, a layer made of $In_{1-y}Ga_yN$ (where $0 \leq y \leq 1$) can be adopted as the well layer, and a layer made of $Al_xGa_yN$ ($x+y=1$) can be adopted as the barrier layer. Adopting a quantum well structure enables emission efficiency in the active layer 5 to be improved by the effect of confining electrons.

The first conductivity-type semiconductor layer 8 has the opposite polarity to that of the second conductivity-type semiconductor layer 4, and is made of a group III-nitride compound semiconductor which is expressed as $Al_xGa_yIn_{1-x-y}N$ (where $0 \leq x \leq 1$, $0 \leq y \leq 1$, and $0 \leq x+y \leq 1$). The first conductivity-type semiconductor layer 8 may be a single layer or may be multi-layered. Further, the layer thickness is also appropriately adjusted according to design variables.

For example, in the embodiment illustrated in FIG. 1, the first conductivity-type semiconductor layer 8 has a two-layer structure including a cladding layer 6 made of $Al_xGa_yN$ ($x+y=1$) and having the opposite polarity to that of the second conductivity-type semiconductor layer 4, and a contact layer 7 made of GaN and having the opposite polarity to that of the second conductivity-type semiconductor layer 4. However, the first conductivity-type semiconductor layer 8 may be a single layer which exerts the function of the contact layer 7 and that of the cladding layer 6, or may be a layer having a superlattice structure. Further, the first conductivity-type semiconductor layer 8 may include a layer having other function, for example, a positive-hole or electron barrier layer (not shown), depending on the polarity of the first conductivity-type semiconductor layer 8.

Moreover, in the upper multi-layered reflective layer 9 illustrated in FIG. 1, layers having smaller refractive indices and made of a group III-nitride compound semiconductor which is expressed as $Al_xGa_yIn_{1-x-y}N$ and layers having larger refractive indices and made of a group III-nitride compound semiconductor are alternately deposited. The provision of the upper multi-layered reflective layer 9, which reflects light produced in the light-emitting region 13 with a low reflectance, enables light produced in the light-emitting region 13 to be alternately reflected between the upper multi-layered reflective layer 9 and the multi-layered reflective layer 3 and to be extracted as a laser beam from the upper boundary surface of the upper multi-layered reflective layer 9 by amplifying only light having a wavelength corresponding to a resonator length equivalent to the thickness of the semiconductor layer 10.

Furthermore, in the multi-layered reflective layer 3 illustrated in FIG. 1, layers having smaller refractive indices and made of a group III-nitride compound semiconductor which is expressed as $Al_xGa_yIn_{1-x-y}N$ and layers having larger refractive indices and made of a group III-nitride compound semiconductor are alternately deposited. The multi-layered reflective layer 3 reflects light produced in the light-emitting region 13 with a high reflectance. It should be noted that such a multi-layered reflective layer 3 is generally called a distributed Bragg reflection (DBR) layer.

The thickness of each layer of the multi-layered reflective layer 3 is determined by parameters such as the wavelength of light produced in the light-emitting region 13, and is given by "$\lambda/(4n)$" (where "$\lambda$" is the wavelength of light produced in the light-emitting region 13 and "n" is the refractive index of each layer of the multi-layered reflective layer 3). Further, the refractive index of each layer of the multi-layered reflective layer 3 can be controlled by the ratio between Al, Ga, and In. Multi-layered reflective layers 3 having various refractive indices can be formed by appropriately adopting desired compositions.

It is desirable that the multi-layered reflective layer 3 includes not less than 20 pairs of layers. The reflectance of the multi-layered reflective layer 3 increases as the number of layers of the multi-layered reflective layer 3 is increased. This is because of a decrease in the quantity of light leaking from the lower boundary surface of the multi-layered reflective layer 3. Accordingly, with the multi-layered reflective layer 3 including not less than 20 pairs of layers, the reflectance of light produced in the light-emitting region 13 at the upper boundary surface of the multi-layered reflective layer 3 can be made sufficiently high, i.e., approximately 60% or more.

Figure 2:
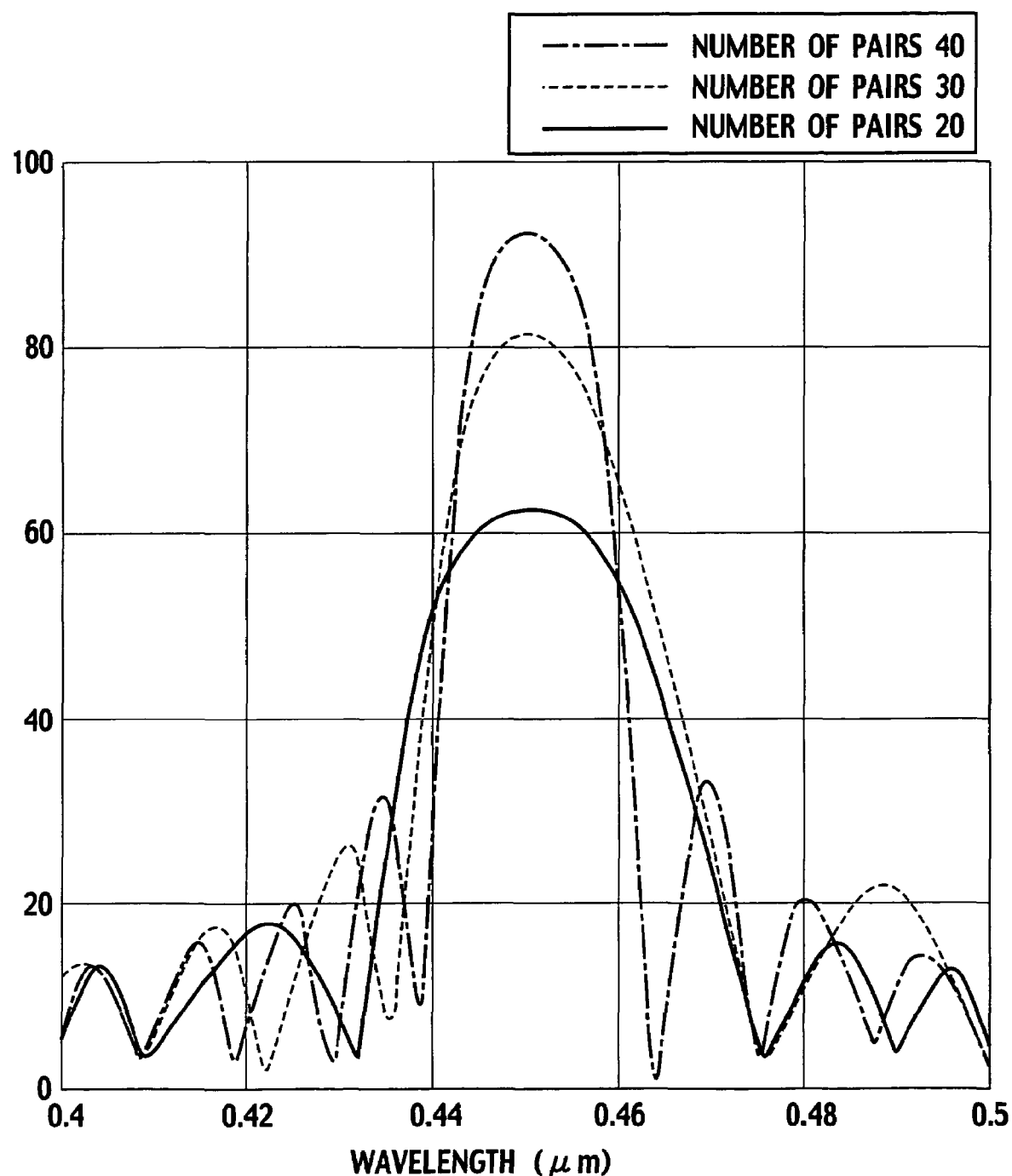
FIG. 2 is a view illustrating reflection characteristics for the case where light produced in a light-emitting region is reflected from a multi-layered reflective layer, with the number of layers included in the multi-layered reflective layer being changed.

FIG. 2 illustrates reflection characteristics for the case where light produced in the light-emitting region 13 is reflected from the multi-layered reflective layer 3, with the number of layers of the multi-layered reflective layer 3 illustrated in FIG. 1 being changed. In FIG. 2, the horizontal axis is the wavelength of light produced in the light-emitting region 13 illustrated in FIG. 1, and the vertical axis is the reflectance at the upper boundary surface of the multi-layered reflective layer 3.

According to FIG. 2, it can be seen that the reflectance increases as the number of layers of the multi-layered reflective layer 3 illustrated in FIG. 1 increases. Further, it can be seen that, with the multi-layered reflective layer 3 including not less than 20 pairs of layers, the reflectance of the multi-layered reflective layer 3 becomes 60% or more, and thus sufficient reflectance can be obtained.

Further, the substrate 1 illustrated in FIG. 1 is made of SiC. Moreover, the phase matching layer 2 may be anything as long as it can be placed between the multi-layered reflective layer 3 and the substrate 1 and has a refractive index different from those of the multi-layered reflective layer 3 and the substrate 1. The purpose is to allow light produced in the light-emitting region 13 to be reflected from the lower boundary surface of the multi-layered reflective layer 3 and to be reflected from the lower boundary surface of the phase matching layer 2. The phase matching layer 2 is made of, for example, aluminum nitride (AlN). Further, the phase matching layer 2 can be formed by, for example, sputtering.

As described in the related art, light produced in the light-emitting region 13 leaks through the lower boundary surface of the multi-layered reflective layer 3 and further propagates in the substrate 1 to be reflected from the lower boundary surface of the substrate 1. The light reflected from the lower boundary surface of the substrate 1 interferes, at the upper boundary surface of the substrate 1, with light reflected from the lower boundary surface of the multi-layered reflective layer 3. Accordingly, in the case where the phase matching layer 2 is not provided, the light reflected from the lower boundary surface of the substrate 1 and the light reflected from the lower boundary surface of the multi-layered reflective layer 3 constructively strength with each other by setting the thickness of the substrate 1 to a length obtained by dividing by the refractive index of the substrate 1 an even or odd multiple of ¼ wavelength of the light produced in the light-emitting region 13.

However, since the thickness of the substrate 1 is approximately 200 times or more of the wavelength of the light produced in the light-emitting region 13, an error on the order of a half-wavelength of the light naturally exists. Accordingly, the phase matching layer 2 is provided to match the phase of the light reflected from the lower boundary surface of the multi-layered reflective layer 3 and the phase of the light reflected from the lower boundary surface of the substrate 1 among the light produced in the light-emitting region 13. The phase matching layer 2 is formed by gradually growing a crystal by, for example, sputtering. Accordingly, the phase matching layer 2 can be formed while the thickness thereof is being easily adjusted, whereby a formation error of the substrate 1 can be complemented.

Further, the thickness of the phase matching layer 2 is set so as to locally maximize the quantity of interfering light produced by the interference of the light reflected from the lower boundary surface of the multi-layered reflective layer 3, the light reflected from the lower boundary surface of the phase matching layer 2, and the light reflected from the lower boundary surface of the substrate 1 among the light produced in the light-emitting region 13, when the substrate 1 has a predetermined thickness.

Here, suppose that the magnitude relationship between the refractive index of the multi-layered reflective layer 3 and that of the phase matching layer 2 and the magnitude relationship between the refractive index of the phase matching layer 2 and that of the substrate 1 are, for example, (the refractive index (2.5) of the multi-layered reflective layer 3)>(the refractive index (2.09) of the phase matching layer 2) and (the refractive index (2.09) of the phase matching layer 2)<(the refractive index (2.55) of the substrate 1).

In this case, the phase of the light produced in the light-emitting region 13 is not reversed at the boundary between the multi-layered reflective layer 3 and the phase matching layer 2, because the light enters a medium having a smaller refractive index from a medium having a larger refractive index. At the boundary between the phase matching layer 2 and the substrate 1, the phase is reversed because the light enters a medium having a larger refractive index from a medium having a smaller refractive index. At the boundary between the substrate 1 and the second electrode 11, the phase is reversed because the electric field at the upper boundary surface of the second electrode 11 is zero.

Incidentally, though the second electrode 11 is provided under the substrate 1 in this embodiment, there are cases where the second electrode 11 is not provided under the substrate 1. For example, there are cases where the area of the substrate 1 is formed to protrude from the layers placed on the substrate 1 and the second electrode is provided in the protruding portion of the substrate 1.

In this case, air exists under the substrate 1. Accordingly, the phase of light entering the substrate 1 is not reversed at the lower boundary surface of the substrate 1 because the light enters a medium having a smaller refractive index from a medium having a larger refractive index at the lower boundary surface of the substrate 1.

Under the aforementioned conditions, the quantity of interfering light produced when the light produced in the light-emitting region 13 interferes at the lower boundary surface of the multi-layered reflective layer 3 can be derived as follows. First, of the light produced in the light-emitting region 13, the light reflected from the lower boundary surface of the multi-layered reflective layer 3 is denoted by "$I_0$", the light reflected from the lower boundary surface of the phase matching layer 2 is denoted by "$I_1$", and the light reflected from the lower boundary surface of the substrate 1 is denoted by "$I_2$". Further, it is assumed that the light quantities (i.e., amplitudes) of "$I_0$", "$I_1$" and "$I_2$" are equal to each-other.

Here, in consideration of a phase difference of the light produced in the light-emitting region 13 due to the passage of the light through each layer, "$I_0$", "$I_1$" and "$I_2$" can be respectively expressed as Formulae 1 to 3 below.

In Formulae 1 to 3, the speed of the light produced in the light-emitting region 13 is denoted by "$c$", the wavelength of the light produced in the light-emitting region 13 is denoted by "$\lambda$", the thickness of the phase matching layer 2 is denoted by "$d_1$ ($\neq 0$)", the refractive index of the phase matching layer 2 is denoted by "$n_1$", the thickness of the substrate 1 is denoted by "$d_2$ ($\neq 0$)", and the refractive index of the substrate 1 is denoted by "$n_2$". It should be noted that "$\alpha$" and "$\beta$" in Formulae 2 and 3 are expressed as formulae 4 and 5, respectively.

$$I_0 = \sin\left(\frac{2\pi}{\lambda}t\right) \tag{Formula 1}$$

$$I_1 = \sin\left(\frac{2\pi c}{\lambda}t - (\alpha + \pi)\right) \tag{Formula 2}$$

$$I_2 = \sin\left(\frac{2\pi c}{\lambda}t - (\alpha + \beta + \pi)\right) \tag{Formula 3}$$

$$\alpha = \frac{2d_1 n_1}{\lambda}\pi \tag{Formula 4}$$

$$\beta = \frac{2d_2 n_2}{\lambda}\pi \tag{Formula 5}$$

In the phase term in "$I_1$" of Formula 2, the reason why "$\Pi n$" is added to a phase difference "$\alpha$" due to the thickness of the phase matching layer 2 is that the phase is reversed at the lower boundary surface of the phase matching layer 2.

Similarly, in "$I_2$" of Formula 3, the reason why "$\Pi$" is added to a phase difference "$(\alpha+\beta)$" due to the thickness of the phase matching layer 2 and that of the substrate 1 is that the phase is reversed at the lower boundary surface of the substrate 1.

Although in this embodiment the phase of the light produced in the light-emitting region 13 is reversed at the lower boundary surface of the phase matching layer 2 and that of the substrate 1 because of the setting of refractive indices, the phase of the light produced in the light-emitting region 13 can also be reversed at the lower boundary surface of the multi-layered reflective layer 3 by setting the refractive indices to other values. Accordingly, if the phase is reversed, "$\Pi$" is added to the phase term in the expression of "$I_0$" of Formula 1. Further, by setting the refractive indices to other values or forming the semiconductor light-emitting device 100 to have other structure, in some cases, the phase of the light produced in the light-emitting region 13 is not reversed at the lower boundary surface of the phase matching layer 2 and that of the substrate 1. In such cases, in the expressions of "$I_1$" and "$I_2$" of Formulae 2 and 3, "$\Pi$" added to the phase term is removed.

From Formulae 1 to 3, interfering light "$I_1$" at the lower boundary surface of the multi-layered reflective layer 3 which is produced by the interference of the light produced in the light-emitting region 13 can be expressed as the following Formula 6:

$$\begin{aligned}I_i &= I_0 + I_1 + I_2 \\ &= \sin\left(\frac{2\pi}{\lambda}t\right) + \sin\left(\frac{2\pi c}{\lambda}t - (\alpha+\pi)\right) + \sin\left(\frac{2\pi c}{\lambda}t - (\alpha+\beta+\pi)\right) \\ &= (1 - \cos\alpha + \cos(\alpha+\beta+\pi))\sin\left(\frac{2\pi}{\lambda}t\right) + \\ &\quad (\sin\alpha - \sin(\alpha+\beta+\pi))\cos\left(\frac{2\pi}{\lambda}t\right) \\ &= (1 - \cos\alpha - \cos(\alpha+\beta))\sin\left(\frac{2\pi}{\lambda}t\right) + \\ &\quad (\sin\alpha + \sin(\alpha+\beta))\cos\left(\frac{2\pi}{\lambda}t\right)\end{aligned} \tag{Formula 6}$$

Accordingly, the quantity "$I_c$" of the interfering light "$I_i$" can be expressed as Formula 7 by squaring the sum of the square of the coefficient of the first term in Formula 6 and the square of the coefficient of the second term in Formula 6. It should be noted that "$A$" and "$\Delta$" in Formula 7 are expressed as Formulae 8 and 9, respectively.

$$\begin{aligned}I_c &= \sqrt{(1-\cos\alpha - \cos(\alpha+\beta))^2 + (\sin\alpha + \sin(\alpha+\beta))^2} \\ &= \sqrt{A^2 + 1 + 2A\sin(\alpha - \Delta)}\end{aligned} \tag{Formula 7}$$

$$A = (2 + 2\cos\beta)^{\frac{1}{2}} \tag{Formula 8}$$

$$\tan\Delta = \frac{\cos\beta + 1}{\sin\beta} \tag{Formula 9}$$

According to Formula 7, it can be seen that when "$\beta$", that is, the thickness "$d_2$" of the substrate 1, is a predetermined value, the quantity "$I_c$" of the interfering light at the lower boundary surface of the multi-layered reflective layer 3 which is produced by the interference of the light produced in the light-emitting region 13 becomes a periodic function which repeats a local maximum and a local minimum depending on "$\alpha$", that is, the thickness "$d_1$" of the phase matching layer 2.

Accordingly, the quantity of the interfering light at the lower boundary surface of the multi-layered reflective layer 3 can be locally maximized by selecting the thickness "$d_1$" of the phase matching layer 2 which locally maximizes the quantity "$I_c$" of the interfering light expressed as Formula 7.

Further, it can be seen that the phase of the light reflected from the lower boundary surface of the multi-layered reflective layer 3 and the phase of the light reflected from the lower boundary surface of the substrate 1 among the light produced in the light-emitting region 13 can be matched by providing the phase matching layer 2.

Moreover, since a formation error of the thickness "$d_2$" of the substrate 1 can be measured in advance, the phase matching layer 2 can be formed by setting the thickness "$d_1$" thereof based on the formation error of the thickness "$d_2$" of the substrate 1.

Figure 5:
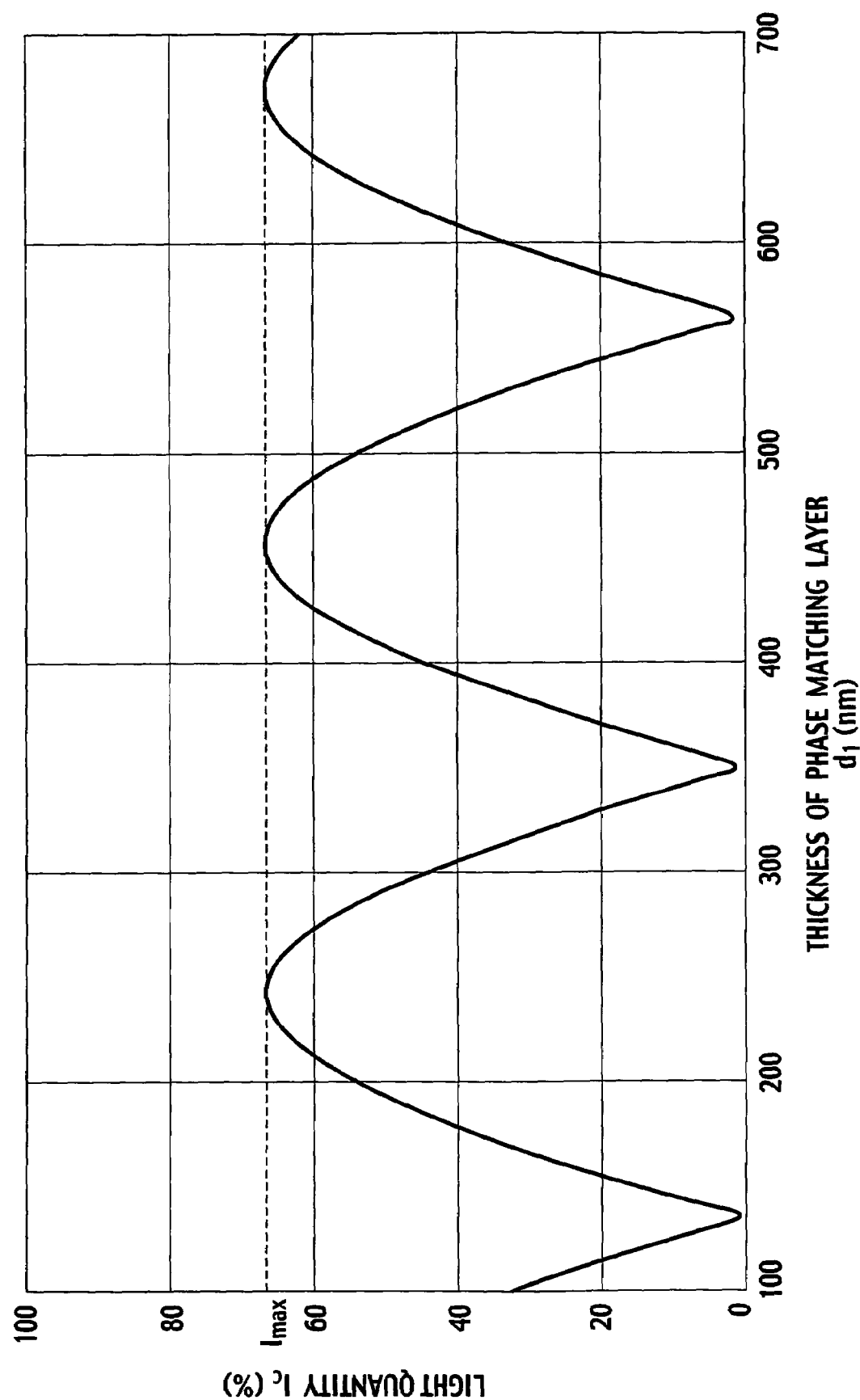
FIG. 5 is a view in which the quantity $I_c$ of interfering light is graphed with respect to the thickness of a phase matching layer.

Here, in FIG. 5, illustrated is a view in which the quantity "$I_c$" of the interfering light expressed as Formula 7 is graphed with respect to the thickness "$d_1$" of the phase matching layer 2, where the thickness "$d_2$" of the substrate 1 is "$d_2=100$ μm", the refractive index "$n_2$" of the substrate 1 is "$n_2=2.55$", and the refractive index "$n_1$" of the phase matching layer 2 is "$n_1=2.09$".

In FIG. 5, the quantity "$I_c$ (%)" of the interfering light expressed as Formula 7 is converted while the maximum value of the quantity "$I_c$" of the interfering light expressed as Formula 7 is defined as 100%, in order to define the quantity of the light produced in the light-emitting region 13 illustrated in FIG. 1 as 100%, and is plotted with respect to the thickness "$d_1$" of the phase matching layer 2.

As illustrated in FIG. 5, it can be seen that the quantity "$I_c$" of the interfering light periodically changes with the increase of the thickness "$d_1$" of the phase matching layer 2. The condition on which the quantity of the interfering light becomes a local maximum "$I_{max}$" can be expressed as Formula 10. Further, from formula 10, the thickness "$d_1$" of the phase matching layer 2 can be expressed as formula 11.

$$\text{if } \alpha - \Delta = \frac{4k_1 - 3}{2}\pi (k_1 \text{ is a natural number}), \quad \text{(Formula 10)}$$
$$\text{then } I_{max} = A + 1$$

$$d_1 = \left(\frac{4k_1 - 3}{2}\pi + \Delta\right)\frac{\lambda}{2n_1\pi} (k_1 \text{ is a natural number}) \quad \text{(Formula 11)}$$

By setting the thickness of the phase matching layer 2 as described above, it becomes possible to locally maximize the quantity of the interfering light produced by the interference of the light reflected from the lower boundary surface of the multi-layered reflective layer 3, the light reflected from the lower boundary surface of the phase matching layer 2, and the light reflected from the lower boundary surface of the substrate 1 among the light produced in the light-emitting region 13. Accordingly, interfering light having a light quantity which is a local maximum can be emitted from the semiconductor light-emitting device 100, and the emission efficiency of the semiconductor light-emitting device 100 can be improved.

Further, it is desirable that the carrier density of the substrate 1 illustrated in FIG. 1 is equal to or less than $10^{19}$ $cm^{-3}$. The carrier density of the substrate 1 relates to the absorptance with which the light produced in the light-emitting region 13 is absorbed by the substrate 1. That is, the absorptance of the substrate 1 increases with increasing carrier density of the substrate 1.

In FIGS. 3A and 3B, illustrated are reflection characteristics for the case where the light produced in the light-emitting region 13 is reflected from the lower boundary surface of the substrate 1, depending on change of the optical absorption coefficient of the substrate 1. FIG. 3A illustrates reflection characteristics for the case where the optical absorption coefficient is 8 $cm^{-1}$, and FIG. 3B illustrates reflection characteristics for the case where the optical absorption coefficient is 100 $cm^{-1}$.

In FIGS. 3A and 3B, the horizontal axis is the wavelength of the light produced in the light-emitting region 13 illustrated in FIG. 1, and the vertical axis is the reflectance of the light produced in the light-emitting region 13 at the lower boundary surface of the substrate 1. Further, in each of these graphs, a dotted line represents a reflected-light spectral curve for the case where the light produced in the light-emitting region 13 is reflected from the upper boundary surface of the multi-layered reflective layer 3, with the reflectance of the multi-layered reflective layer 3 being 100%.

According to FIGS. 3A and 3B, in the case where the optical absorption coefficient of the substrate 1 is 100 $cm^{-1}$, the spectral curve is entirely lowered because the quantity of light absorbed in the substrate 1 is large, and therefore sufficient reflectance cannot be obtained. On the other hand, in the case where the optical absorption coefficient of the substrate 1 is 8 $cm^-$, the spectral curve of the light reflected from the lower boundary surface of the substrate 1 approximately coincides with the spectral curve of the light reflected from the multi-layered reflective layer 3, and therefore sufficient reflectance can be obtained.

Thus, it can be seen that the optical absorption coefficient of the substrate 1 is desirably as low as possible, in order to increase the reflectance of the light produced in the light-emitting region 13 at the lower boundary surface of the substrate 1. That is, it is desirable that the carrier density of the substrate 1 is as low as possible.

Figure 4:
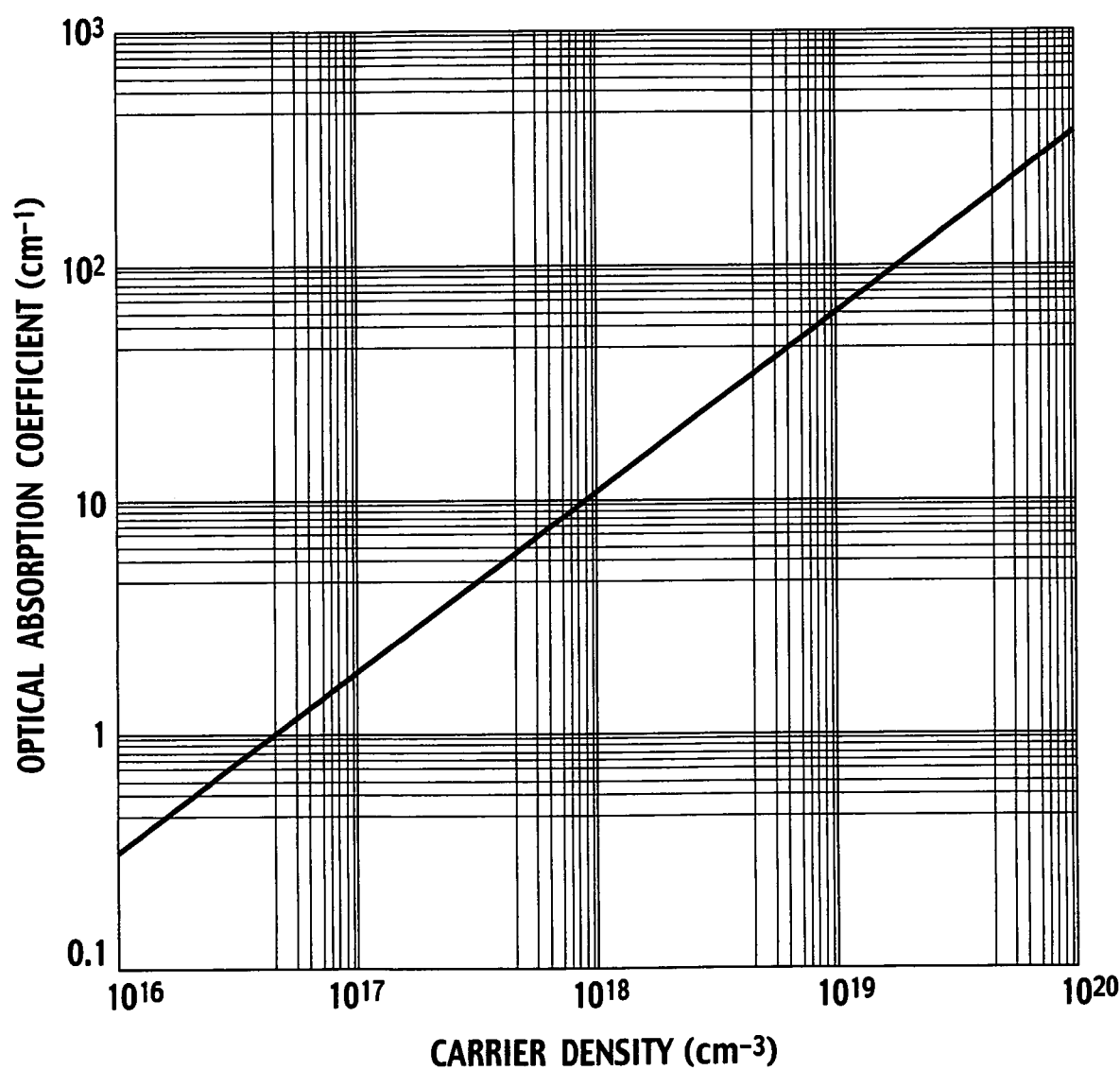
FIG. 4 is a view illustrating absorption characteristics for the case where light produced in the light-emitting region is absorbed by the substrate, with the carrier density of the substrate being changed.

Further, FIG. 4 illustrates absorption characteristics for the case where the light produced in the light-emitting region 13 is absorbed by the substrate 1, with the carrier density of the substrate 1 illustrated in FIG. 1 being changed. In FIG. 4, the horizontal axis is the carrier density of the substrate 1 illustrated in FIG. 1, and the vertical axis is the optical absorption coefficient for the case where light is absorbed by the substrate 1.

According to FIG. 4, it can be seen that the optical absorption coefficient increases as the carrier density of the substrate 1 illustrated in FIG. 1 is increased. When the carrier density of the substrate 1 is set to $10^{19}$ $cm^{-3}$ or less, the optical absorption coefficient becomes equal to or less than 30 $cm^{-1}$. In the case where the optical absorption coefficient is equal to or less than 30 $cm^{-1}$, the light produced in the light-emitting region 13 decreases in quantity by not more than approximately 45% after passing through the substrate 1.

When the amount of light attenuation is equal to or less than 45%, a sufficient light quantity can be obtained in which the light reflected from the lower boundary surface of the substrate 1 influences the emission efficiency of the semiconductor light-emitting device 100. Further, when the amount of light attenuation is equal to or less than 45%, the ratio of contribution to destructively interfering light becomes large even in the case where the light reflected from the lower boundary surface of the substrate 1 destructively interferes with the light reflected from the lower boundary surface of the multi-layered reflective layer 3.

Accordingly, setting the carrier density of the substrate 1 to not more than $10^{19}$ $cm^{-3}$ makes it possible to increase the quantity of light constructively interfering at the lower boundary surface of the multi-layered reflective layer 3 as described previously. Thus, the emission efficiency of the semiconductor light-emitting device 100 can be improved by allowing the constructively interfering light to be emitted from the semiconductor light-emitting device 100.

Further, the first electrode 12 illustrated in FIG. 1 may be anything as long as it is electrically connected to the upper multi-layered reflective layer 9 and can form an ohmic contact to the upper multi-layered reflective layer 9. For example, Ti/Al, Ni/Au, ZnO, ITO, or the like can be adopted as the first electrode 12. All of these materials have high electrical conductivities, and therefore the power consumption of the semiconductor light-emitting device 100 does not increase.

Moreover, the second electrode 11 illustrated in FIG. 1 may be anything as long as it is electrically connected to the substrate 1 and can form an ohmic contact to the substrate 1. For example, an electrode made of material such as Ti/Al, Ni/Au, ZnO, or ITO can be adopted as the second electrode 11. All of these materials have high electrical conductivities, and therefore the power consumption of the semiconductor light-emitting device 100 does not increase.

As described above, the semiconductor light-emitting device 100 includes the phase matching layer 2, the multi-layered reflective layer 3, and the semiconductor layer 10 in this order on the substrate 1. Heretofore, a low-temperature buffer layer formed at low temperature has been provided between the substrate 1 and the semiconductor layer 10, in order to match the lattice constant of the substrate 1 and that of the semiconductor layer 10. That is, the semiconductor light-emitting device 100 according to this embodiment has a structure in which the above-described low-temperature buffer layer is omitted.

Here, a method of manufacturing the semiconductor light-emitting device according to this embodiment will be described with reference to FIG. 1 by showing specific numeric values.

First, the thickness of the substrate 1 made of SiC is set. Here, the wavelength of the light produced in the light-emitting region 13 is 450 nm, and the refractive index of the substrate 1 is 2.55. The thickness of the substrate 1 is set to 100 μm. Further, the carrier density of the substrate 1 is set to $10^{19}$ cm$^{-3}$.

On the substrate 1, aluminum nitride (AlN) as the phase matching layer 2 is formed by sputtering. The thickness of the phase matching layer 2 is set to a thickness which locally maximizes the quantity of interfering light produced by the interference of the light reflected from the lower boundary surface of the multi-layered reflective layer 3, the light reflected from the lower boundary surface of the phase matching layer 2, and the light reflected from the lower boundary surface of the substrate 1. In this embodiment, the refractive index of AlN is 2.09, the refractive index of the substrate 1 is 2.55, and the thickness of the substrate 1 is 100 μm. Accordingly, the thickness of the phase matching layer 2 is set to, for example, 467 nm ($k_1$=3) according to Formula 11.

Next, on the formed phase matching layer 2, the multi-layered reflective layer 3 including 20 pairs of n-type $In_{1-y}Ga_yN$ (e.g., x=0 and y=0.98) and n-type AlGaN (e.g., x=0.2 and y=0.8), a total of 40 layers, is formed by MOCVD at relatively low temperature using TMG, TMA, TMI, and $NH_3$ as material. The thickness of each layer is approximately 35 nm. Subsequently, the second conductivity-type semiconductor layer 4 which has a thickness of approximately 0.1 to 5 μm and which is made of n-type GaN is formed.

Next, the active layer 5 made of undoped, n-type, or p-type $In_yGa_{1-y}N$ (e.g., y=0.06) is formed to a thickness of approximately 0.05 to 0.1 μm. Subsequently, the cladding layer 6 made of p-type AlGaN (e.g., z=0.15) is formed to a thickness of approximately 0.01 to 0.3 μm, and then the contact layer 7 made of p-type GaN is formed to a thickness of approximately 0.1 to 0.2 μm. In this embodiment example, the cladding layer 6 and the contact layer 7 are formed as the first conductivity-type semiconductor layer 8.

In order to form the second conductivity-type semiconductor layer 4 as an n-type, Si, Ge, or Te is mixed into a reactant gas in the form of an impurity material gas such as $SiH_4$, $GeH_4$, or $TeH_4$. However, in the case of an n-type, even if no impurity is mixed therein, the second conductivity-type semiconductor layer 4 is naturally formed into an n-type because nitrogen readily evaporates at the time of deposition. Therefore, this property may be utilized.

Next, on the first conductivity-type semiconductor layer 8, the upper multi-layered reflective layer 9 including 5 pairs of n-type $In_{1-y}Ga_yN$ (e.g., x=0 and y=0.98) and n-type AlGaN (e.g., x=0.2 and y=0.8), a total of 10 layers, is formed by MOCVD at relatively low temperature using TMG, TMA, TMI, and $NH_3$ as material. The thickness of each layer is approximately 35 nm.

Subsequently, a protective film (not shown) made of $SiO_2$, $Si_3N_4$, or the like is provided on the entire surface of the semiconductor layer 10 grown. Then, annealing is performed at 400 to 800° C. for approximately 20 to 60 minutes, whereby the cladding layer 6, which is of a p-type, is activated. It should be noted that the annealing may be performed without providing the protective film.

Next, metal films of Ti, Au, Al, or the like are formed as the first and second electrodes 12 and 11 by sputtering, vapor deposition, or the like. The substrate 1 is ultimately lapped and then diced into individual chips, whereby the semiconductor light-emitting device 100 is completed.

Additional advantages and modifications will readily occur to those skilled in the art. Therefore, the invention in its broader aspects is not limited to the specific details and the representative embodiments shown and described herein. Accordingly, various modifications may be made without departing from the scope of the general inventive concept as defined by the appended claims and their equivalents.

What is claimed is:

1. A semiconductor light-emitting device made of a group III-nitride compound semiconductor expressed as $Al_xGa_yIn_{1-x-y}N$ (where $0 \leq x \leq 1$, $0 \leq y \leq 1$, and $0 \leq x+y \leq 1$), the semiconductor light-emitting device comprising:
    a substrate made of SiC;
    a semiconductor layer which is placed above the substrate and has a light-emitting region;
    a multi-layered reflective layer which is placed between the substrate and the semiconductor layer and which reflects light produced in the light-emitting region; and
    a phase matching layer which is placed between the substrate and the multi-layered reflective layer and which reflects light produced in the light-emitting region and matches a phase of light reflected from a lower boundary surface of the multi-layered reflective layer and a phase of light reflected from a lower boundary surface of the substrate among light produced in the light-emitting region,
    wherein a thickness of the phase matching layer is set so that a quantity of interfering light produced by the interference of light reflected from the lower boundary surface of the multi-layered reflective layer, light reflected from a lower boundary surface of the phase matching layer, and light reflected from the lower boundary surface of the substrate among light produced in the light-emitting region is locally maximized when the substrate has a predetermined thickness.

2. The semiconductor light-emitting device according to claim 1, wherein a carrier density of the substrate is equal to or less than $10^{19}$ cm$^{-3}$.

3. The semiconductor light-emitting device according to claim 1, wherein the number of layers included in the multi-layered reflective layer is equal to or more than 20 pairs.

* * * * *